United States Patent
He

(10) Patent No.: US 7,036,219 B2
(45) Date of Patent: May 2, 2006

(54) METHOD FOR MANUFACTURING A HIGH-EFFICIENCY THERMAL CONDUCTIVE BASE BOARD

(75) Inventor: Ju-Liang He, Taichung (TW)

(73) Assignee: Feng Chia University, (TW)

( * ) Notice: Subject to any disclaimer, the term of this patent is extended or adjusted under 35 U.S.C. 154(b) by 70 days.

(21) Appl. No.: 10/816,257

(22) Filed: Apr. 1, 2004

(65) Prior Publication Data

US 2005/0223551 A1    Oct. 13, 2005

(51) Int. Cl.
*H01R 9/00* (2006.01)

(52) U.S. Cl. ............... 29/842; 29/825; 29/832; 29/846

(58) Field of Classification Search ........... 29/825, 29/842, 846, 832
See application file for complete search history.

(56) References Cited

U.S. PATENT DOCUMENTS

| | | | | |
|---|---|---|---|---|
| 4,420,767 A | * | 12/1983 | Hodge et al. | 257/713 |
| 4,617,729 A | * | 10/1986 | Celnik | 29/840 |
| 5,120,384 A | * | 6/1992 | Yoshimitsu et al. | 156/242 |
| 5,214,844 A | * | 6/1993 | McWilliams et al. | 29/840 |
| 5,230,788 A | * | 7/1993 | Rabiet et al. | 205/328 |
| 5,688,606 A | * | 11/1997 | Mahulikar et al. | 428/615 |
| 5,774,336 A | * | 6/1998 | Larson | 361/720 |
| 5,998,000 A | * | 12/1999 | Ikeda et al. | 428/210 |
| 6,700,069 B1 | * | 3/2004 | McDermott et al. | 174/255 |
| 6,703,135 B1 | * | 3/2004 | Dietz et al. | 428/469 |

FOREIGN PATENT DOCUMENTS

JP    10-050621    *    2/1998

* cited by examiner

*Primary Examiner*—Carl J. Arbes
(74) *Attorney, Agent, or Firm*—McNees Wallace & Nurick LLC

(57) ABSTRACT

A method for manufacturing a high-efficiency thermal conductive base board for electrical connection with an electronic component includes the steps of: (a) placing a metal substrate in an electrolytic bath; (b) oxidizing the metal substrate in the electrolytic bath to form a metal oxide layer thereon through micro-arc oxidation; (c) forming a plurality of conductive contacts on the metal oxide layer for electrical connection with the electronic component.

10 Claims, 3 Drawing Sheets

METHOD FOR MANUFACTURING A HIGH-EFFICIENCY THERMAL CONDUCTIVE BASE BOARD

BACKGROUND OF THE INVENTION

1. Field of the Invention

This invention relates to a method for manufacturing a high-efficiency thermal conductive base board, more particularly to a method for manufacturing a high-efficiency thermal conductive base board having a metal substrate formed with a metal oxide layer through micro-arc oxidation.

2. Description of the Related Art

In the past, both heat dissipation and electrical insulation requirements for electronic and photoelectric components can be satisfied by using a plastic substrate since the heat resulting from operation of these components is not too high. Since information and communication products are in wide use nowadays, the need for electronic devices, such as dynamic random access memories (DRAM), in the market has increased, and manufacturing processes of the semiconductor and photoelectric components have progressed toward very large scale integration (VLSI). The heat dissipating problem for devices with multilevel interconnects is serious and cannot be disregarded.

As shown in FIG. 1, a conventional base board 1 used in electronic devices includes an aluminum substrate 11, an epoxy resin layer 12 formed on the aluminum substrate 11, and copper contacts 13 that are electrochemically plated on the epoxy resin layer 12.

It is noted that since the difference in surface properties between the epoxy resin layer 12 and the copper contacts 13 is relatively large, the copper contacts 13 can hardly bond to the epoxy resin layer 12. Hence, prior to electrochemical plating of the copper contacts 13 on the epoxy resin layer 12, a series of pre-treatments, such as roughening the surface of the epoxy resin layer 12, and sensitizing and activating the surface of the epoxy resin layer 12 via oxidation-reduction reaction, have to be conducted so as to improve adhesion of the copper contacts 13 to the epoxy resin layer 12.

The conventional base board 1 has the following drawbacks:

(1) The epoxy resin layer 12 has a thermal conductivity as low as 0.2 W/m/K that cannot meet current heat-dissipating requirements of the integrated circuit industry and that can result in a reduction in the service lives of components bonded to the substrate 11 due to such low thermal conductivity.

(2) Prior to electrochemical plating of the copper contacts 13, the surface of the epoxy resin layer 12 is required to be pre-treated, and such pre-treatment is complicated and costly.

(3) Since the surface of the epoxy resin layer 12 is required to be pre-treated by roughening, narrow line width of the integrated circuit cannot be achieved.

(4) Formation of the copper contacts 13 through electrochemical plating is a source of water pollution.

SUMMARY OF THE INVENTION

Therefore, the object of the present invention is to provide a method for manufacturing a high-efficiency thermal conductive base board that can overcome the aforesaid drawbacks of the prior art.

According to the present invention, a method for manufacturing a high-efficiency thermal conductive base board for electrical connection with an electrical component includes the steps of: (a) placing a metal substrate in an electrolytic bath; (b) oxidizing the metal substrate in the electrolytic bath to form a metal oxide layer thereon through micro-arc oxidation; and (c) forming a plurality of conductive contacts on the metal oxide layer for electrical connection with the electronic component.

BRIEF DESCRIPTION OF THE DRAWINGS

Other features and advantages of the present invention will become apparent in the following detailed description of the preferred embodiment of the invention, with reference to the accompanying drawings. In the drawings.

DETAILED DESCRIPTION OF THE PREFERRED EMBODIMENT

Figure 2:
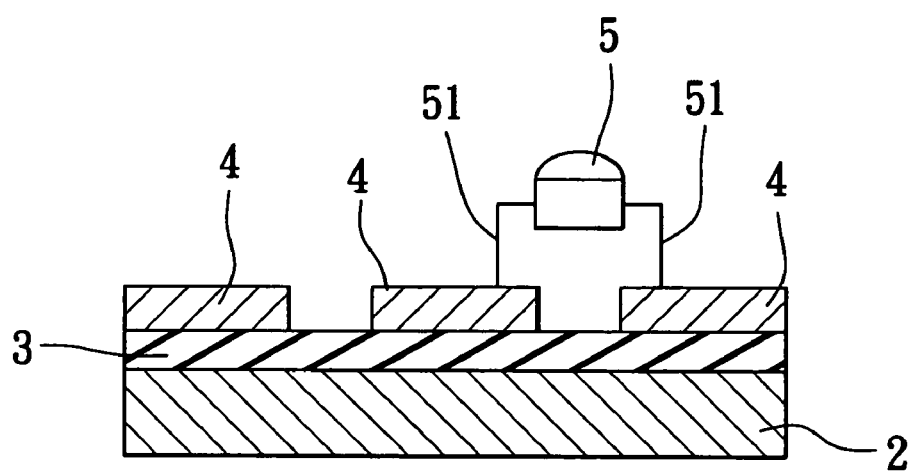
FIG. 2 is a cross-sectional view to illustrate the preferred embodiment of a high-efficiency thermal conductive base board connected to a light emitting diode according to this invention.

Referring to FIG. 2, a high-efficiency thermal conductive base board prepared using the method of this invention is shown to be connected to an electronic component 5, such as a light emitting diode, having two conductive leads 51 that extend outwardly therefrom, a metal substrate 2, a metal oxide layer 3 formed on the metal substrate 2, and a plurality of conductive contacts 4 formed on the metal oxide layer 3 and connected electrically and respectively to the conductive leads 51 of the light emitting diode 5.

In this embodiment, the metal suitable for manufacturing the metal substrate 2 includes but is not limited to aluminum, titanium, magnesium, zirconium, beryllium, tantalum and alloys thereof. Preferably, the metal substrate 2 of the base board prepared according to this invention is made from aluminum.

The metal oxide layer 3 is formed on the metal substrate 2 through micro-arc oxidation, and is made from a metal oxide selected from the group consisting of alumina, titania, magnesia, zirconia, beryllia, tantalum oxide and mixtures thereof. Preferably, the metal oxide layer 3 formed on the metal substrate 2 is made from alumina.

The metal suitable for forming the conductive contacts 4 on the metal oxide layer 3 includes but is not limited to copper, silver, zinc, titanium and tungsten. Preferably, the conductive contacts 4 are made from copper.

Figure 3:
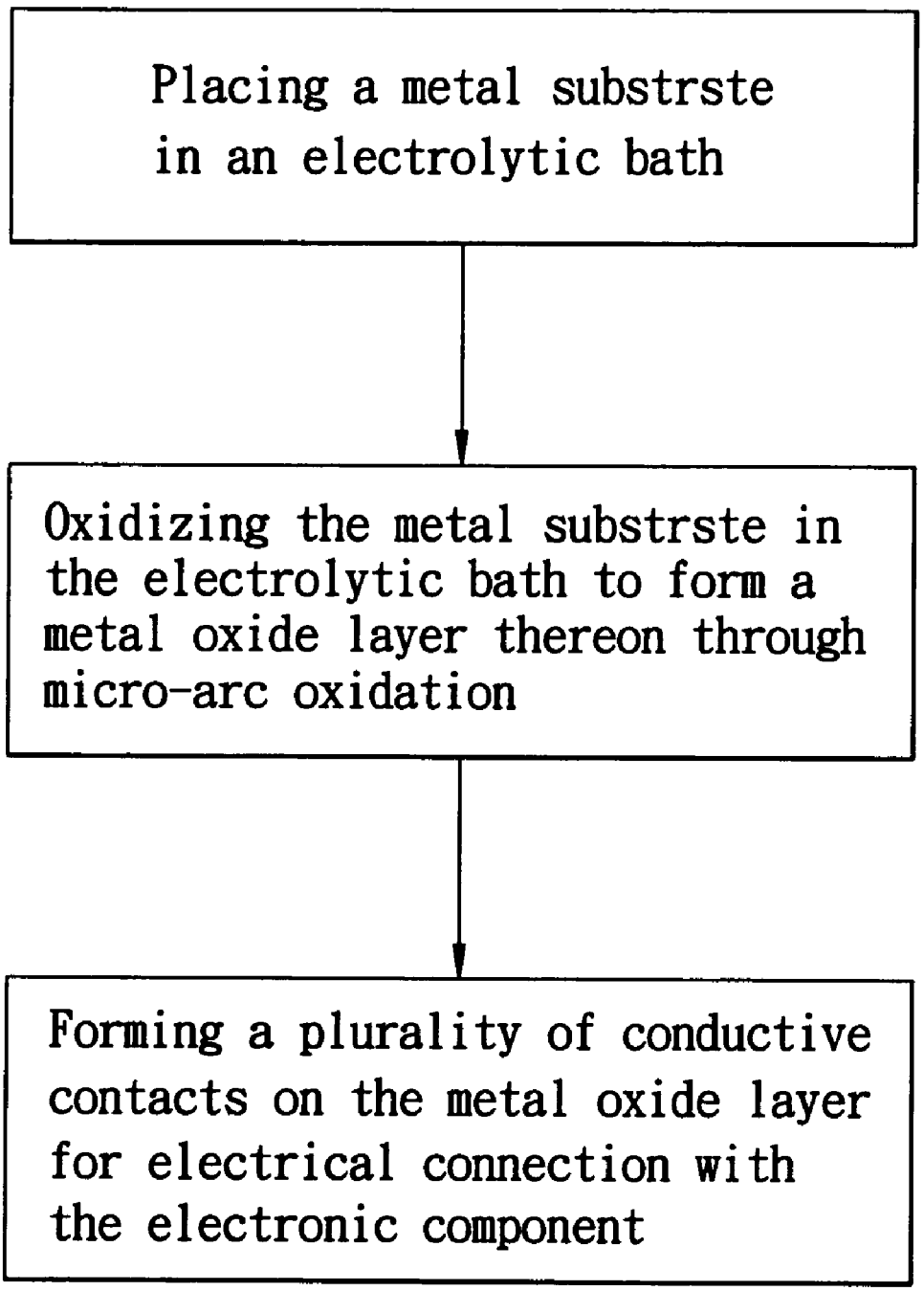
FIG. 3 is a flow chart to illustrate consecutive steps of the preferred embodiment of a method for manufacturing the high-efficiency thermal conductive base board according to this invention.

With further reference to FIG. 3, the preferred embodiment of a method for manufacturing the high-efficiency thermal conductive base board for electrical connection with an electronic component 5 according to this invention includes the steps of: (a) placing a metal substrate 2 in an electrolytic bath; (b) oxidizing the metal substrate 2 in the electrolytic bath to form a metal oxide layer 3 thereon through micro-arc oxidation; and (c) forming a plurality of conductive contacts 4 on the metal oxide layer 3 for electrical connection with the electronic component 5.

Preferably, the electronic component 5 is a high power electronic component, such as a light emitting diode.

In this embodiment, the conductive contacts 4 may be formed on the metal oxide layer 3 by covering the metal oxide layer 3 with a patterned mask, followed by conducting physical vapor deposition. Alternatively, the conductive contacts 4 may be formed through the following steps: (i) forming a patterned photoresist layer on the metal oxide layer 3 using photolithography; (ii) forming the conductive contacts 4 that correspond to the pattern of the photoresist layer formed on the metal oxide layer 3 through vacuum deposition; and (iii) removing the patterned photoresist layer from the metal oxide layer 3 such that the conductive contacts 4 are left on the metal oxide layer 3.

Preferably, the metal substrate 2 is made from a metal selected from the group consisting of aluminum, titanium, magnesium, zirconium, beryllium, tantalum and alloys thereof. More preferably, the metal substrate 2 is made from aluminum.

In step (b), the metal substrate 2, such as an aluminum substrate, is placed in the electrolytic bath having an electrolyte composition, and is subsequently oxidized through micro-arc oxidation at a predetermined temperature for a predetermined period of time so as to form the metal oxide layer 3 on the metal substrate 2. Preferably, the electrolytic bath includes an ammoniacal aqueous solution. More preferably, the ammoniacal aqueous solution includes a water soluble salt and a conduction-aiding agent.

The water soluble salt contained in the ammoniacal aqueous solution includes but is not limited to phosphates, chromates, silicates, carbonates and mixtures thereof. Preferably, the water soluble salt includes the mixture of phosphates and chromates. More preferably, the water soluble salt includes the mixture of potassium dihydrogen phosphate and potassium chromate.

The conduction-aiding agent contained in the ammoniacal aqueous solution is a compound that is capable of being dissociated into acetate ions. Preferably, the conduction-aiding agent is copper acetate. In a more preferred embodiment, the electrolytic bath used in step (b) of the method according to this invention consists of 2 to 6 percent by volume of the ammoniacal aqueous solution of 0.3 to 0.6 mole/liter (M) potassium dihydrogen phosphate; 0.08 to 0.3 mole/liter (M) potassium chromate; and acetate ions in concentrations of 0.08 to 0.5 mole/liter (M).

The micro-arc oxidation of the metal substrate 2 in step (b) is conducted at a temperature ranging from 0° C. to 150° C. and, preferably, from 0° C. to 40° C. The oxidation time ranges from 20 minutes to 150 minutes and, preferably, from 20 minutes to 100 minutes.

In this embodiment, the physical vapor deposition for forming the conductive contacts 4 includes, but is not limited to, cathodic arc plasma ion plating, sputtering, e-beam evaporation and thermal evaporation. Preferably, the conductive contacts 4 are formed through cathodic arc plasma ion plating by the following steps: placing the metal substrate 2 formed with the metal oxide layer 3 on a base that is disposed in a reaction chamber equipped with a gas source and a cathodic metal target; applying a predetermined voltage to the cathodic metal target using a power supply under a predetermined pressure so as to create a predetermined current for inducing an arc discharge that forms metallic atoms and ions; and depositing the metallic atoms and ions on the metal oxide layer 3 on the metal substrate 2 for a predetermined period of time so as to form the conductive contacts 4.

More preferably, the cathodic metal target is made from a metal selected from the group consisting of copper, silver, zinc, titanium and tungsten. Most preferably, the cathodic metal target is made from copper. The gas source suitable for conducting cathodic arc plasma ion plating in this preferred embodiment includes but is not limited to Ar, $N_2$, $H_2$ and mixtures thereof. Preferably, the predetermined pressure ranges from 0.1 Pa to 100 Pa, the predetermined voltage ranges from 20 V to 30 V, the predetermined current ranges from 10 A to 150 A, and the predetermined period of time ranges from 10 minutes to 300 minutes.

EXAMPLE 1

A high-efficiency thermal conductive base board was prepared by first placing an aluminum substrate 2 in an electrolytic bath consisting of 4.5 percent by volume of the ammoniacal aqueous solution of 0.5 mole/liter (M) potassium dihydrogen phosphate, 0.1 mole/liter (M) potassium chromate, and 0.35 mole/liter (M) of copper acetate. The surface of the aluminum substrate 2 was oxidized through micro-arc oxidation at a temperature ranging from 0° C. to 40° C. under a current density of 0.045 A/cm$^2$ for 30 minutes so as to form an alumina layer 3 having a thickness of approximately 15 μm on the aluminum substrate.

After formation of the alumina layer 3 on the aluminum substrate 2, a plurality of conductive contacts 4 were formed on the alumina layer 3 through cathodic arc plasma ion plating. First, the aluminum substrate 2 formed with the alumina layer 3 was placed on a base disposed in a reaction chamber. A mask that was patterned through laser etching was placed on the alumina layer 3 of the aluminum substrate 2. Using hydrogen gas as the gas source, the cathodic copper target was provided with a voltage of 25V by a power supply under an operational pressure of 4 Pa so as to form a current of 90 A. An arc discharge occurred on the surface of the copper target so as to generate copper atoms and copper ions during plating. A bias pulse (−50 V(40%)+78 V(60%)) was applied to the base for a period of 100 minutes so as to permit deposition of the copper atoms and the copper ions on the mask and the alumina layer 3. A pattern of copper contacts 4 is formed on the alumina layer 3 after the mask is removed.

Compared with the conventional anodic treatment, the arc oxidation rate of dissociated aluminum ions in the electrolytic bath is faster, and the alumina layer 3 has higher purity, higher compactness and lower porosity. Therefore, the short circuit problem resulting from filling of copper in the pores of the alumina layer 3 during the formation of copper contacts 4 can be avoided.

In addition, the cathodic arc plasma ion plating techniques can create a high current by applying a low voltage to the cathodic target, which results in arc discharge on the surface of the cathodic target, which, in turn, results in fast ionization of copper from the surface of the copper target. As a consequence, the growing rate of the conductive contacts 4 using cathodic arc plasma ion plating is high, and the compactness of the conductive contacts 4 is enhanced.

Figure 1:
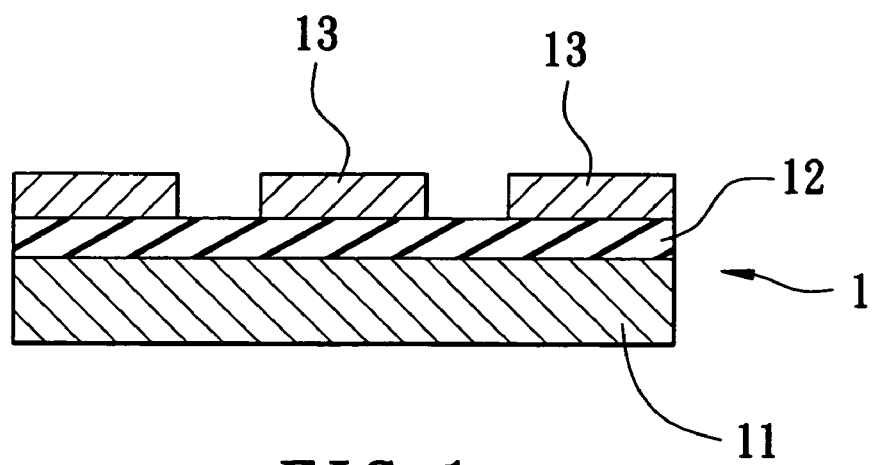
FIG. 1 is a cross-sectional view to illustrate a conventional base board used in electronic devices.
Figure 4:
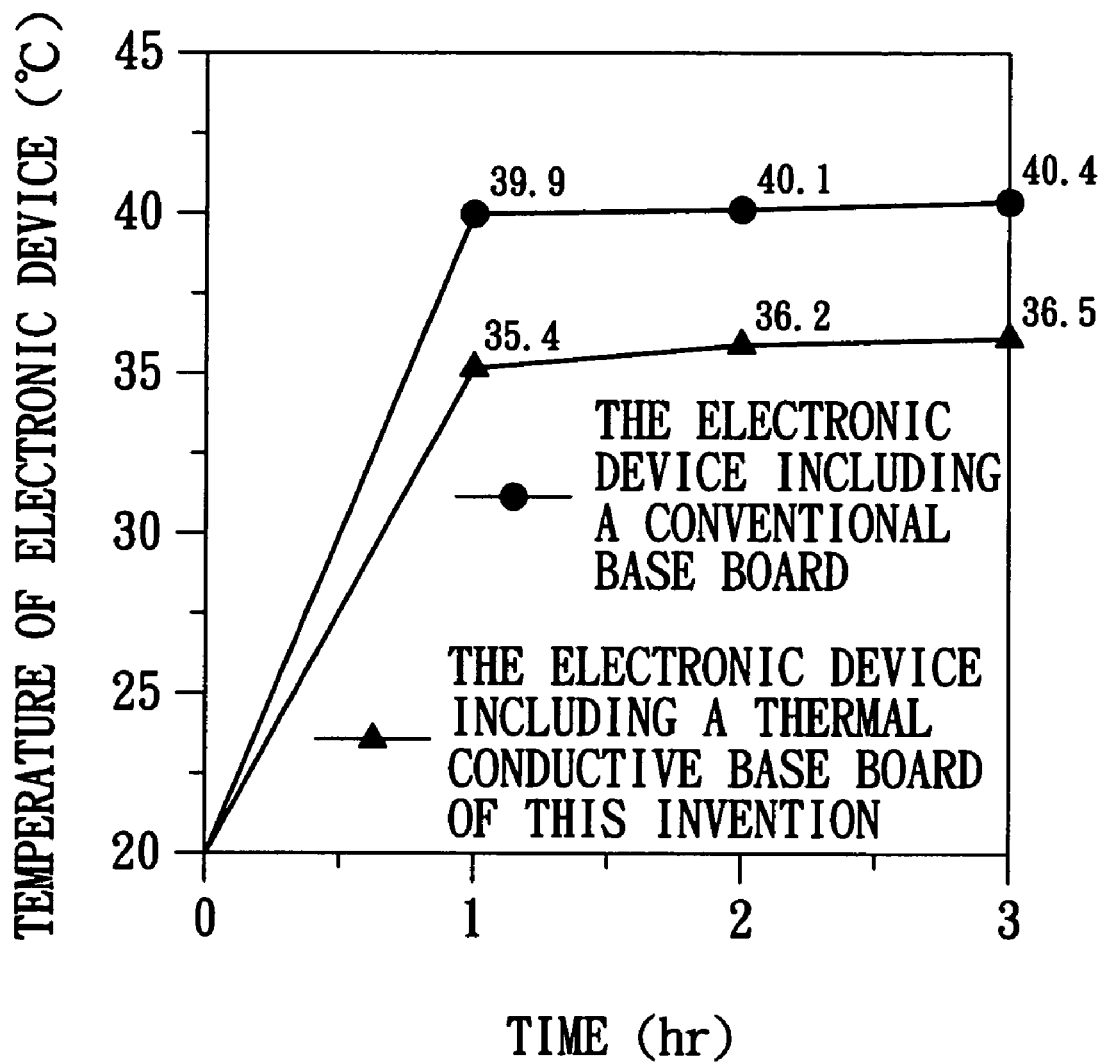
FIG. 4 is a curve plot to illustrate comparison of heat dissipating effect between the conventional base board and the high-efficiency thermal conductive base board of this invention.

FIG. 4 illustrates the comparison of heat dissipating effect between the aforesaid conventional base board 1 as shown in FIG. 1 and the high-efficiency thermal conductive base board obtained from Example 1. The test was conducted by applying 0.75 A driving current to a light emitting diode connected to the conventional base board 1 and a light emitting diode connected to the high-efficiency thermal conductive base board of this invention for 3 hours. Since the alumina layer 3 formed on the aluminum substrate 2 has a thermal conductivity of 35 W/m/K, the heat generated from the light emitting diode can be quickly dissipated through the alumina layer 3 and the aluminum substrate 2. Hence, the light emitting diode connected to the high-efficiency thermal conductive base board of this invention has a better heat dissipating effect than that of the conventional base board 1.

EXAMPLE 2

A high-efficiency thermal conductive base board was prepared in a manner similar to that of Example 1, except for the formation of copper contacts. In this example, a patterned photoresist layer was formed on the alumina layer 3 through photolithography, and a copper film was then formed on the alumina layer 3 under the same operational conditions as those of Example 1. Finally, the photoresist layer was removed so as to form the copper contacts 4.

The high-efficiency thermal conductive base board prepared according to this invention has specific functions and properties as follows:

(1) The thickness of the metal oxide layer 3 is sufficient for providing electrical insulation.

(2) The purity and compactness of the metal oxide layer 3 is sufficient to effectively avoid the short circuit problem during the formation of the conductive contacts 4.

(3) The thermal conductivity of the metal oxide layer 3 is relatively high so as to effectively dissipate heat generated by the electronic component, such as light emitting diode 5, mounted on the metal substrate 2.

(4) The adhesion of the conductive contacts 4 to the metal oxide layer 3 is relatively strong so as to provide an excellent thermal mechanical property for resisting stress present in the electronic component due to heat generated therein.

(5) The conductive contacts 4 have high compactness and low electrical resistivity for reducing the generation of Joule heating.

(6) According to the above-mentioned (3) to (5) the electronic component connected to the metal substrate 2 of this invention has a longer service life.

(7) Water pollution problem as encountered in the conventional copper plating technique can be avoided by using the cathodic arc plasma ion plating techniques.

(8) The conductive contacts 4 having narrow line width can be achieved using photolithography techniques.

(9) The formation rates of the metal oxide layer 3 through micro-arc oxidation and the conductive contacts 4 through cathodic arc plasma ion plating are high. Hence, the production time for manufacturing the high-efficiency thermal conductive base board is reduced.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

I claim:

1. A method for manufacturing a high-efficiency thermal conductive base board for electrical connection with an electronic component, comprising the steps of:
   (a) placing a metal substrate in an electrolytic bath;
   (b) oxidizing the metal substrate in the electrolytic bath to form a metal oxide layer thereon through micro-arc oxidation; and
   (c) forming a plurality of conductive contacts on the metal oxide layer for electrical connection with the electronic component.

2. The method of claim 1, wherein the conductive contacts are formed through cathodic arc plasma ion plating in step (c).

3. The method of claim 1, wherein the metal substrate is made from a metal selected from the group consisting of aluminum, titanium, magnesium, zirconium, beryllium, tantalum and alloys thereof.

4. The method of claim 3, wherein the metal substrate is made from aluminum.

5. The method of claim 1, wherein the electrolytic bath includes an ammoniacal aqueous solution.

6. The method of claim 5, wherein the ammoniacal aqueous solution includes a water soluble salt that is selected from the group consisting of phosphates, chromates, silicates, carbonates and mixtures thereof, and a conduction-aiding agent that is capable of being dissociated into acetate ions.

7. The method of claim 6, wherein the electrolytic bath consists of 2 to 6 percent by volume of the ammoniacal aqueous solution of 0.3 to 0.6 mole/liter potassium dihydrogen phosphate; 0.08 to 0.3 mole/liter potassium chromate; and acetate ions in concentrations of 0.08 to 0.5 mole/liter.

8. The method of claim 7, wherein the conduction-aiding agent is copper acetate.

9. The method of claim 1, wherein the oxidation of the metal substrate in the electrolytic bath is conducted at a temperature ranging from 0° C. to 150° C.

10. The method of claim 9, wherein the temperature ranges from 0° C. to 40° C.

* * * * *